United States Patent [19]

Prinz

[11] Patent Number: 5,582,872
[45] Date of Patent: Dec. 10, 1996

[54] ELECTROSTATIC DISSIPATIVE LAMINATE AND METHOD FOR MAKING

[75] Inventor: Brian A. Prinz, Guilford, Conn.

[73] Assignee: Current Inc., East Haven, Conn.

[21] Appl. No.: 217,967

[22] Filed: Mar. 28, 1994

[51] Int. Cl.⁶ ............................ C08J 5/24; B05D 1/38; B05D 1/28; B05D 3/02
[52] U.S. Cl. ............... 427/407.3; 264/258; 264/297.4; 264/297.5; 264/331.12; 427/370; 427/381; 427/393.1; 427/386
[58] Field of Search ................................ 427/370, 381, 427/393.1, 407.3, 410, 359, 386; 156/307.3; 264/258, 297.2, 297.5, 297.4, 331.12

[56] References Cited

U.S. PATENT DOCUMENTS

| | | | |
|---|---|---|---|
| 2,956,613 | 10/1960 | Edelman et al. | 427/407.3 |
| 3,660,199 | 5/1972 | Riccitiello et al. | 156/307.7 |
| 3,698,940 | 10/1972 | Mersereau et al. | |
| 3,922,383 | 11/1975 | Wilks et al. | 427/82 |
| 3,935,053 | 1/1976 | Armstrong, Jr. | 156/378 |
| 3,960,803 | 6/1976 | Smith et al. | 427/386 |
| 4,024,305 | 5/1977 | Alpaugh et al. | 427/407.3 |
| 4,101,693 | 7/1978 | Tsen et al. | 427/386 |
| 4,180,608 | 12/1979 | Del | 156/307.7 |
| 4,239,808 | 12/1980 | Arnason | 428/482 |
| 4,338,357 | 7/1982 | Pichler et al. | 427/202 |
| 4,534,998 | 8/1985 | DuPont et al. | 427/393.1 |
| 4,550,128 | 10/1985 | Chellis | 427/386 |
| 4,749,614 | 6/1988 | Andrews et al. | 427/407.3 |
| 4,784,908 | 11/1988 | Ungar et al. | 428/332 |
| 4,786,528 | 11/1988 | Amelio et al. | 427/289 |
| 4,806,410 | 2/1989 | Armington et al. | 427/393.1 |
| 4,814,698 | 3/1989 | St. Onge et al. | |
| 4,889,750 | 12/1989 | Wiley | |
| 4,910,050 | 3/1990 | Oldham et al. | |
| 4,954,389 | 9/1990 | Acharya et al. | 427/407.1 |
| 4,981,544 | 1/1991 | Nordale | |
| 4,997,703 | 3/1991 | Gehrig | 427/407.3 |
| 5,043,184 | 8/1991 | Fujii et al. | |
| 5,067,046 | 11/1991 | Elton et al. | |
| 5,110,669 | 5/1992 | Knobel et al. | |
| 5,160,374 | 11/1992 | Frederickson et al. | |
| 5,330,595 | 7/1994 | Held | 156/64 |

Primary Examiner—Diana Dudash
Attorney, Agent, or Firm—McCormick, Paulding & Huber

[57] ABSTRACT

An electrostatic dissipative laminate formed from a layup comprising a plurality of sheets of glass cloth saturated with liquid thermosetting epoxy resin and dried to a B-stage (prepreg). A uniform coating of another thermosetting epoxy resin compound applied to the material which defines a surface of the layup includes a carbon base and a catalyst and has an electrical resistance in the range from about 300 to about 400 ohm/sq/mil. After the coating has dried to a B-stage the layup is cured at a controlled temperature and under a controlled pressure for a predetermined period of time.

17 Claims, 1 Drawing Sheet

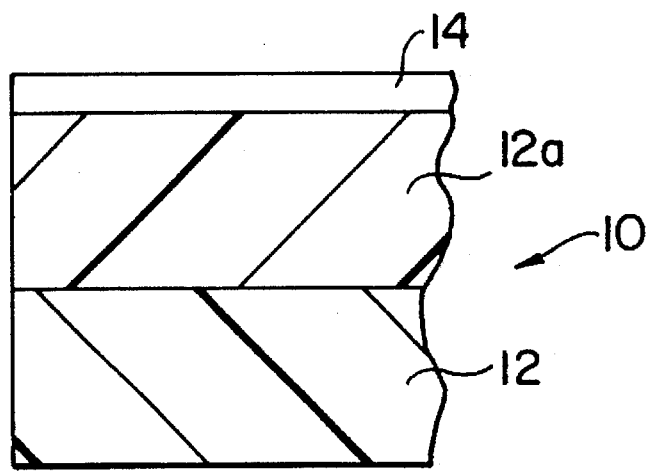

ELECTROSTATIC DISSIPATIVE LAMINATE AND METHOD FOR MAKING

BACKGROUND OF THE INVENTION

This invention relates in general to sheet materials and deals more particularly with an improved dielectric laminate having at least one electrostatic dissipative surface and methods for making such a laminate.

The proliferation of electronic products has created a growing need for supporting and packaging materials to protect sensitive electronic components from electrostatic charges during manufacture and use. Many electronic devices, such as printed circuits and microchips, are extremely vulnerable to damage from static discharge. Static charges generated by the normal handling of such electronic devices and resulting from friction, motion, induction and the separation of dissimilar materials, for example, may result in static discharges in the order of ten thousand volts. Sheet materials used in manufacturing, supporting and packaging of such electrostatically sensitive devices must protect against such potentially damaging rapid static discharges.

An ideal packaging material must be lightweight, durable and capable of being readily fabricated into a desired configuration. Glass epoxy laminates have proven particularly satisfactory for this purpose. However, where such material has been used in electronic packaging it has been common practice to provide a post cure application of an antistatic substance or surface coating on a substantial portion of the surface of the material. The additional operation required to apply this antistatic coating adds substantially to the cost of producing the finished product. Further, such an anti-static surface coating is subject to deterioration, normal wear and damage resulting from handling and may require periodic maintenance.

Accordingly, it is the general aim of the present invention to provide a dielectric laminate including at least one integral surface having a resistivity from about $10^5$ to $10^{12}$ ohms/sq while retaining other desirable physical properties of the laminate and without the need for a post productive surface coating on the material.

SUMMARY OF THE INVENTION

In accordance with the present invention an electrostatic dissipative laminate comprises a layup formed from dielectric sheet material impregnated with a first thermosetting epoxy resin compound and dried to a B-stage. A coating of a second thermosetting epoxy compound having a controlled thickness is applied to a surface of the B-stage material which defines a surface of the layup. The second thermosetting epoxy compound contains a conductive base and a catalyst and has an electrical resistance in the range from about 300 to about 400 ohm/sq/mil and is also dried to a B-stage. The coated B-stage layup is cured for a predetermined period of time at elevated temperature and pressure.

BRIEF DESCRIPTION OF THE DRAWING

The drawing illustrates somewhat schematically a fragmentary cross sectional view of a coated prepreg layup used in making a laminate in accordance with the present invention.

DETAILED DESCRIPTION OF PREFERRED EMBODIMENTS AND METHODS

A laminate embodying the present invention and made in accordance with the invention has a dielectric substrate and at least one integral surface which imparts to the laminate the ability to dissipate an electrostatic charge. This integral semi-conductive surface enables controlled discharge of a static charge to ground so that the charge is dissipated relatively quickly, but not instantaneously. This characteristic renders the material particularly suitable for use as a supporting or packaging material for sensitive electronic components or devices which are easily damaged by exposure to rapid electrostatic discharge.

The laminate is made by curing a layup formed from prepreg material under controlled conditions of temperature and pressure for a predetermined period of time. Various dielectric sheet materials may be used to make the prepreg material from which the layup is formed, but preferably fiberglass cloth is employed for this purpose. The prepreg material is preferably produced in continuous form by advancing a web of fiberglass cloth through a continuous coating machine which saturates or impregnates the cloth with a thermosetting liquid epoxy resin compound. The impregnated material is preferably maintained in continuous form for passage through a drying oven which dries the material to a B-stage (prepreg).

Some of the prepreg material produced in the aforedescribed manner and which is also used in making the layups is further processed by applying to a surface of the material a coating of a second thermosetting epoxy compound containing a conductive base and a catalyst and having an electrical resistance in the range from about 300 to about 400 ohms/sq/mil.

The presently preferred coating material is a polymer thick film carbon conductor available from Olin Hunt Specialty Products Inc., Ontario, Calif. and is further described as 44DJB125 (part A carbon base) and 44DJB126 (part B catalyst). This material has an electrical resistance in the range from about 300 to 400 ohm/square/mil and a viscosity of 16–20 seconds (#2 Zahn Cup at 25° C.). The two components (Parts A and B) are thoroughly mixed before being applied to the prepreg material and may, if necessary, be reduced with a suitable solvent such as methyl isobutyl keytone. The coating material is preferably metered onto the surface of the layup using metering rolls, for examples, so that the thickness of the coating may be accurately controlled. The coating thickness is generally within a range from about 0.001 inches to about 0.062 inches, a thickness within the range of about 0.002 inches to 0.003 inches being presently preferred for most applications. The coating operation may, if desired, be performed as a continuous operation by metering coating material onto an advancing web of prepreg material.

Upon completion of the coating application the coating is dried to a B-stage. Preferably, the drying operation is performed by spreading the coated prepreg material on a substantially flat supporting surface and allowing the material to air dry. This drying procedure assures uniformity of coating thickness. In accordance with presently preferred practice a layup is formed from the material after the coating on the prepreg material has dried to a B-stage.

A typical layup used in making a laminate of the present invention is shown in the drawing and indicated generally by the reference numeral 10. The illustrated layup 10 has two laminations or plys formed by prepreg material indicated at 12 and 12a. However, it should be understood that the number of laminations which comprise the layup and which are used in forming the dielectric substrate may vary and will be determined by the required thickness of the finished product. The uppermost lamination of the layup 10 is formed by the coated prepreg indicated at 12a, the B-stage coating on the prepreg being indicated by the numeral 14 and defining the upper surface of the layup as shown.

The B-stage layup is cured for a predetermined period of time at an elevated temperature within the range from about 150° F. to about 400° F. and under applied pressure in the range from about 400 psi to 800 psi, the most preferred temperature being within the range from about 280° F. to about 330° F. The presently preferred curing temperature is about 300° F.

The curing time required to finish the product will depend to some degree on the required thickness of the finished product. A typical finished product has a thickness in the range from about 0.125 inches to about 0.375 inches and requires a curing time from about 1 to about 2 hours.

A typical laminated product having a thickness within the range of about 0.187 to about 0.210 inches is formed from a layup having at least twenty-five prepreg plys (B stage) and an applied coating of conductive epoxy on at least one outer surface, the surface coating having a thickness of 0.003 inches. The layup is cured at a temperature in the range from 300° to 325° F. at an applied pressure of about 600 psi for approximately one and one half hours.

The applied coating of carbon base thermosetting epoxy material, is compatible with the thermosetting epoxy prepreg material to which it is applied and becomes an integral part of the finished product defining at least one surface of the product, the latter surface having an electrical resistance in the range of $10^5$ to $10^{12}$ ohms/sq.

I claim:

1. A method for making an electrostatic dissipative laminate comprising the steps of impregnating dielectric sheet material with a first thermosetting epoxy resin compound, drying the impregnated sheet material to form a prepreg sheet material, forming a layup from the prepreg sheet material, applying to a surface of a sheet of the prepreg sheet material for defining a surface of the layup a coating of a second thermosetting epoxy compound containing a conductive base and a catalyst and having an electrical resistance in the range from about 300 to about 400 ohms/sq/mil, drying the coating to a B-stage, and curing the coated layup at a temperature within the range from about 150° to about 400° F. and under an applied pressure from about 400 psi to 800 psi whereby to form a laminate having an integral electrostatic dissipative surface.

2. A method for making an electrostatic dissipative laminate as set forth in claim 1 wherein said step of applying a coating and said step of drying the coating to a B-stage are performed before the step of forming a layup from the prepreg sheet material.

3. A method for making an electrostatic dissipative laminate as set forth in claim 1 wherein the step of curing the coated layup is performed from one to two hours.

4. A method for making electrostatic dissipative laminate as set forth in claim 1 wherein the step of curing is performed at a temperature within the range from about 280° F. to about 330° F.

5. A method for making electrostatic dissipative laminate as set forth in claim 1 wherein the step of curing is performed at a temperature of about 300° F.

6. A method for making electrostatic dissipative laminate as set forth in claim 1 wherein the step of applying a coating is further characterized as metering a coating of a controlled thickness.

7. A method for making electrostatic dissipative laminate as set forth in claim 6 wherein the step of metering is further characterized as metering a coating having a thickness in the range from about 0.001 inches to about 0.062 inches.

8. A method for making electrostatic dissipative laminate as set forth in claim 6 wherein the step of metering is further characterized as metering a coating having a thickness in the range from about 0.002 inches to about 0.003 inches.

9. A method for making an electrostatic dissipative laminate comprising the steps of impregnating dielectric sheet material with a first thermosetting epoxy resin compound, drying the impregnated sheet material to a B-stage to form a first prepreg material, applying to a surface of first prepreg material a coating of a second thermosetting epoxy compound having a thickness within the range of about 0.001 inches to 0.002 inches and containing a conductive base and a catalyst and having an electrical resistance in the range from about 300 to 400 ohms/sq/mil, drying the coating on the first prepreg material to a B-stage to form a second prepreg material, combining at least one lamination of first prepreg material and at least one lamination of second prepreg material to form a layup having a surface defined by the B-stage coating on the second prepreg material, and curing the layup for about one and one half hours at a temperature within the range from 300° F. to 325° F. and at a pressure of about 600 psi to form the laminate.

10. A method for making an electrostatic dissipative laminate comprising the steps of impregnating glass fabric with a liquid thermosetting epoxy resin compound, drying the impregnated fabric to a B-stage to form a prepreg sheet material, forming a layup from the prepreg sheet material, metering onto a surface of the prepreg sheet material which defines a surface of the layup a coating of another epoxy compound including a carbon base and a catalyst and having an electrical resistance in the range from about 300 to about 400 ohms/sq/mil and a thickness in the range from about 0.001 inches to about 0.062 inches, drying the coating to a B-stage, and curing the coated layup for one and one half hours at a temperature in the range from about 150° F. to about 400° F. and under an applied pressure in the range from about 400 psi to about 800 psi after the step of drying the coating to a B-stage has been performed whereby to form a laminate having an integral electrostatic dissipative surface.

11. A method for making an electrostatic dissipative laminate as set forth in claim 10 wherein the steps of metering a coating and drying the coating to a B-stage are performed before the step of forming a layup from the prepreg sheet material.

12. A method for making an electrostatic dissipative laminate as set forth in claim 11 wherein the step of curing is performed at a temperature within the range from about 280° F. to about 330° F.

13. A method for making an electrostatic dissipative laminate as set forth in claim 11 wherein the step of curing is performed from about 1 hour to about two hours.

14. A method for making an electrostatic dissipative laminate as set forth in claim 11 wherein the step of curing is performed at a temperature of about 300° F.

15. A method for making an electrostatic dissipative laminate as set forth in claim 11 wherein the step of metering is further characterized as metering a coating of said epoxy compound having a thickness the range from about 0.002 inches to about 0.003 inches.

16. A method for making an electrostatic dissipative laminate as set forth in claim 11 wherein the step of curing is performed under an applied pressure of about 600 psi.

17. A method for making an electrostatic dissipative laminate as set forth in claim 11 wherein the step of metering is performed with metering rolls.

* * * * *